(12) United States Patent
Kim et al.

(10) Patent No.: US 9,818,699 B2
(45) Date of Patent: Nov. 14, 2017

(54) SEMICONDUCTOR PACKAGES AND METHODS OF FABRICATING THE SAME

(71) Applicant: Samsung Electronics Co., Ltd., Suwon-si, Gyeonggi-do (KR)

(72) Inventors: Young-Ja Kim, Cheonan-si (KR); Bongchan Kim, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/065,850

(22) Filed: Mar. 9, 2016

(65) Prior Publication Data

US 2016/0268216 A1 Sep. 15, 2016

(30) Foreign Application Priority Data

Mar. 10, 2015 (KR) .................. 10-2015-0033255

(51) Int. Cl.
| | |
|---|---|
| *H05K 9/00* | (2006.01) |
| *H05K 13/00* | (2006.01) |
| *H01L 23/552* | (2006.01) |
| *H01L 21/56* | (2006.01) |
| *H01L 21/78* | (2006.01) |
| *H01L 23/31* | (2006.01) |
| *H01L 23/00* | (2006.01) |

(52) U.S. Cl.
CPC .......... *H01L 23/552* (2013.01); *H01L 21/561* (2013.01); *H01L 21/78* (2013.01); *H01L 23/3128* (2013.01); *H01L 24/97* (2013.01); *H01L 2224/16227* (2013.01); *H01L 2224/48227* (2013.01); *H01L 2224/97* (2013.01); *H01L 2924/15311* (2013.01); *H01L 2924/15313* (2013.01); *H01L 2924/3025* (2013.01)

(58) Field of Classification Search
CPC ... H01L 24/3025; H01L 21/78; H01L 21/565; H01L 23/552; H01L 23/3128; H01L 2924/3025; H01L 2924/00; H01L 2924/00012
See application file for complete search history.

(56) References Cited

U.S. PATENT DOCUMENTS

| | | |
|---|---|---|
| 6,849,800 B2 | 2/2005 | Mazurkiewicz |
| 7,030,469 B2 | 4/2006 | Mahadevan et al. |
| 7,342,303 B1 | 3/2008 | Berry et al. |
| 7,700,411 B2 | 4/2010 | Yang et al. |
| 7,898,066 B1 | 3/2011 | Scanlan et al. |

(Continued)

FOREIGN PATENT DOCUMENTS

| | | |
|---|---|---|
| JP | 2012169315 A | 9/2012 |
| KR | 1019980063374 | 10/1998 |

(Continued)

*Primary Examiner* — Caridad Everhart

(74) *Attorney, Agent, or Firm* — Renaissance IP Law Group LLP

(57) ABSTRACT

Provided is a method of fabricating a semiconductor package. The method includes providing a substrate including a plurality of semiconductor chips; forming a mold layer covering the semiconductor chips; forming a first shielding layer on the mold layer; cutting the mold layer and the first shielding layer to form trenches between the semiconductor chips; and forming a second shielding layer to fill the trenches.

19 Claims, 12 Drawing Sheets

(56) References Cited

U.S. PATENT DOCUMENTS

| | | | |
|---|---|---|---|
| 7,989,928 B2* | 8/2011 | Liao | H01L 21/568 |
| | | | 257/659 |
| 8,004,369 B2 | 8/2011 | Kwon et al. | |
| 8,053,872 B1 | 11/2011 | Swan et al. | |
| 8,199,518 B1* | 6/2012 | Chun | H01L 23/49811 |
| | | | 361/767 |
| 8,598,690 B2 | 12/2013 | Chandra et al. | |
| 8,653,633 B2 | 2/2014 | Liao et al. | |
| 8,653,634 B2 | 2/2014 | Chiu et al. | |
| 8,720,051 B2 | 5/2014 | Leahy et al. | |
| 8,736,030 B2 | 5/2014 | Yao et al. | |
| 8,921,993 B2 | 12/2014 | Choi et al. | |
| 9,018,741 B2 | 4/2015 | Kim et al. | |
| 2004/0022003 A1 | 2/2004 | Mazurkiewicz | |
| 2005/0039946 A1* | 2/2005 | Nakao | H05K 1/0218 |
| | | | 174/255 |
| 2005/0067676 A1 | 3/2005 | Mahadevan et al. | |
| 2008/0061407 A1 | 3/2008 | Yang et al. | |
| 2008/0210462 A1* | 9/2008 | Kawagishi | H01L 21/561 |
| | | | 174/377 |
| 2009/0296353 A1 | 12/2009 | Kim et al. | |
| 2010/0156523 A1 | 6/2010 | Kwon et al. | |
| 2011/0198737 A1 | 8/2011 | Yao et al. | |
| 2011/0235282 A1 | 9/2011 | Leahy et al. | |
| 2011/0260301 A1 | 10/2011 | Liao et al. | |
| 2012/0104571 A1 | 5/2012 | Yoo | |
| 2012/0119348 A1 | 5/2012 | Chandra et al. | |
| 2013/0082368 A1 | 4/2013 | Kim et al. | |
| 2013/0107484 A1* | 5/2013 | Sakuma | H01L 23/49816 |
| | | | 361/768 |
| 2013/0154066 A1 | 6/2013 | Kim et al. | |
| 2013/0307128 A1* | 11/2013 | Lin | H01L 23/49805 |
| | | | 257/659 |
| 2013/0328176 A1 | 12/2013 | Chiu et al. | |
| 2014/0160699 A1* | 6/2014 | Zhang | H01L 23/552 |
| | | | 361/752 |
| 2014/0328023 A1 | 11/2014 | Choi et al. | |
| 2014/0377911 A1 | 12/2014 | Wu | |

FOREIGN PATENT DOCUMENTS

| | | |
|---|---|---|
| KR | 100373848 B1 | 2/2003 |
| KR | 1020050061646 | 6/2005 |
| KR | 100600202 B1 | 9/2006 |
| KR | 100645755 B1 | 11/2006 |
| KR | 1020010069478 | 7/2007 |
| KR | 1020090123221 | 12/2009 |
| KR | 101011888 B1 | 2/2011 |
| KR | 1020110020548 | 3/2011 |
| KR | 1020110099966 | 9/2011 |
| KR | 101076972 | 10/2011 |
| KR | 101176800 | 8/2012 |
| KR | 1020120098667 | 9/2012 |
| KR | 1020130035620 | 4/2013 |
| KR | 101288284 | 7/2013 |
| KR | 101335378 | 12/2013 |
| KR | 101349546 | 1/2014 |
| KR | 1020140130916 | 11/2014 |
| KR | 101533866 | 7/2015 |

* cited by examiner

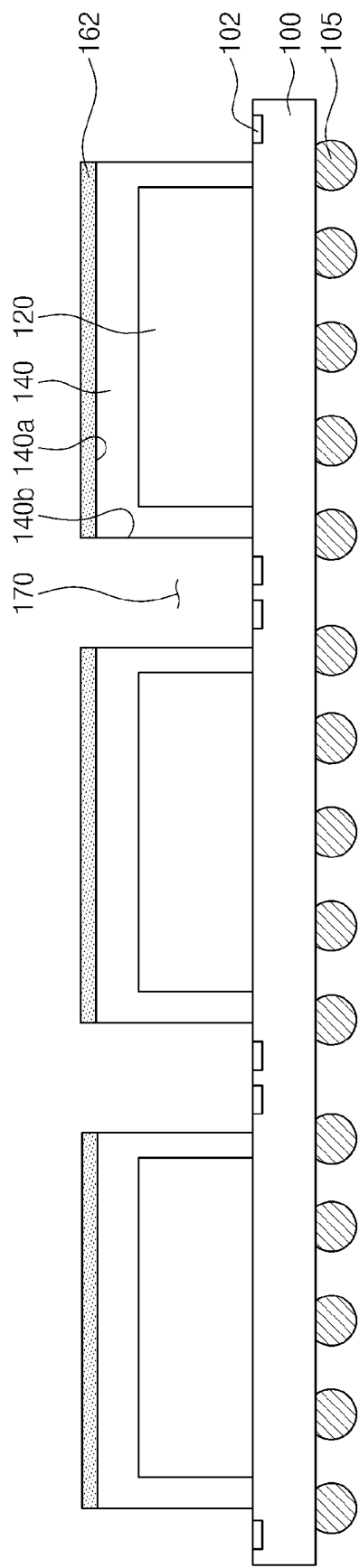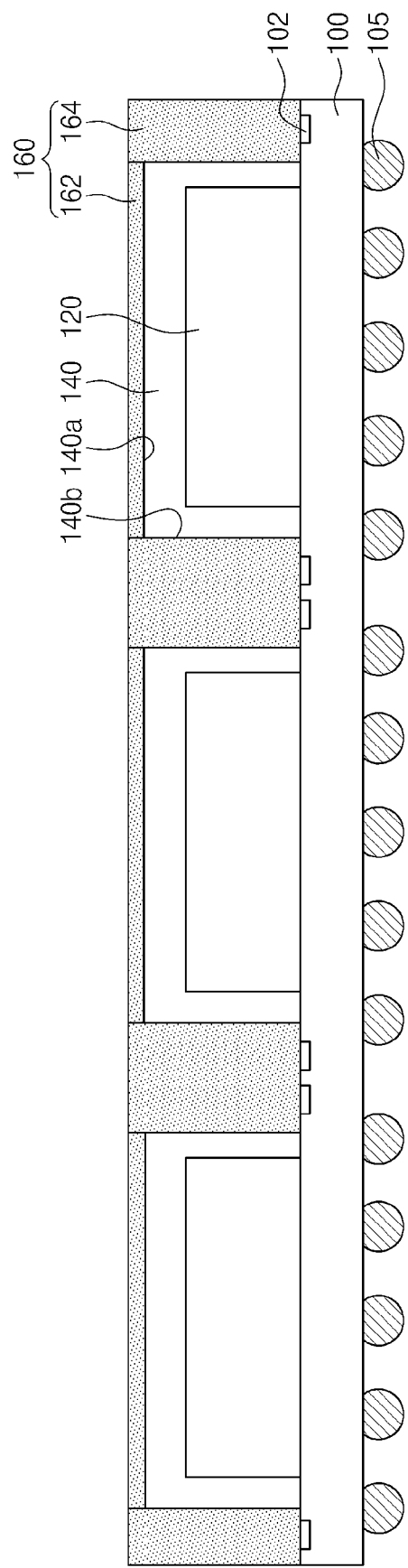

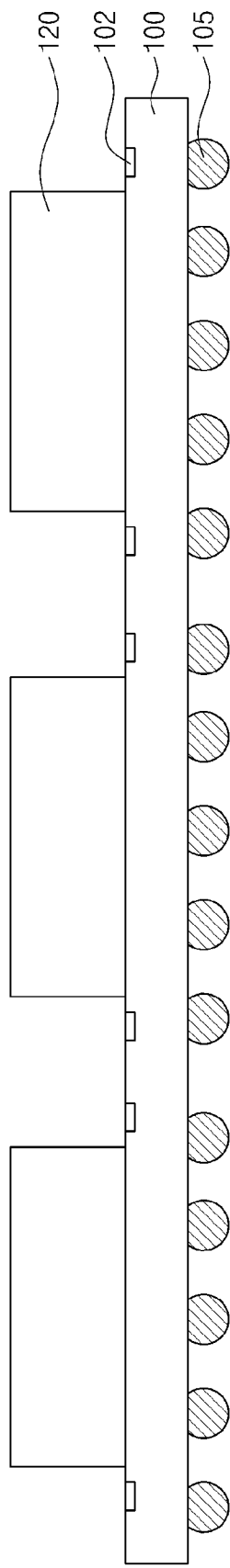
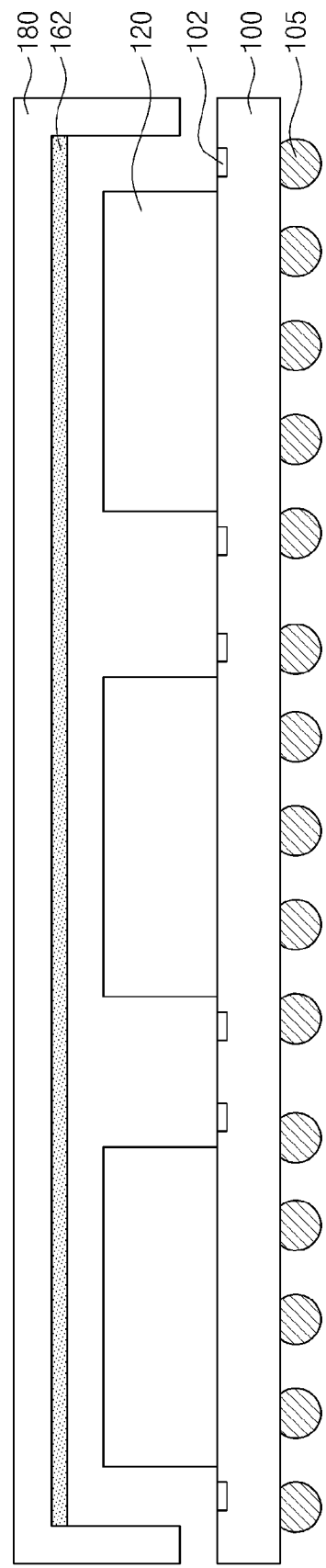

SEMICONDUCTOR PACKAGES AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2015-0033255, filed on Mar. 10, 2015, in the Korean Intellectual Property Office, the entire contents of which are hereby incorporated by reference.

BACKGROUND OF THE INVENTION

Embodiments relate to a semiconductor package and a method of fabricating the same, and in particular, to a semiconductor package using a shielding film and a method of fabricating the same.

As the mobile market expands, research on electromagnetic waves in electronic devices are actively conducted. To overcome an electromagnetic interference (EMI) problem, a metal enclosure has been applied to a module and a set of modules; however, technical issues (such as electromagnetic noise or malfunction) caused by the EMI may occur at semiconductor packages provided in the metal enclosure. This may lead to deterioration in reliability of an electronic device. Furthermore, interest in a relation between electromagnetic waves and human health has increased.

SUMMARY

An embodiment includes a method including providing a substrate including a plurality of semiconductor chips; forming a mold layer covering the semiconductor chips; forming a first shielding layer on the mold layer; cutting the mold layer and the first shielding layer to form trenches between the semiconductor chips; and forming a second shielding layer to fill the trenches.

An embodiment includes a method including providing a substrate including a plurality of semiconductor chips; forming a mold layer covering the semiconductor chips; forming a first shielding layer on the mold layer; removing portions of the mold layer and portions of the first shielding layer to expose ground patterns on the substrate under the removed portions of the mold layer; and electrically connecting a second shielding layer between the ground pattern and the first shielding layer.

BRIEF DESCRIPTION OF THE DRAWINGS

Embodiments will be more clearly understood from the following brief description taken in conjunction with the accompanying drawings. The accompanying drawings represent non-limiting examples as described herein.

FIGS. 2A through 2E are sectional views illustrating a method of fabricating a semiconductor package, according to some embodiments.

FIGS. 3A through 3D are sectional views illustrating a method of fabricating a semiconductor package, according to other embodiments.

DETAILED DESCRIPTION

Figure 1A:
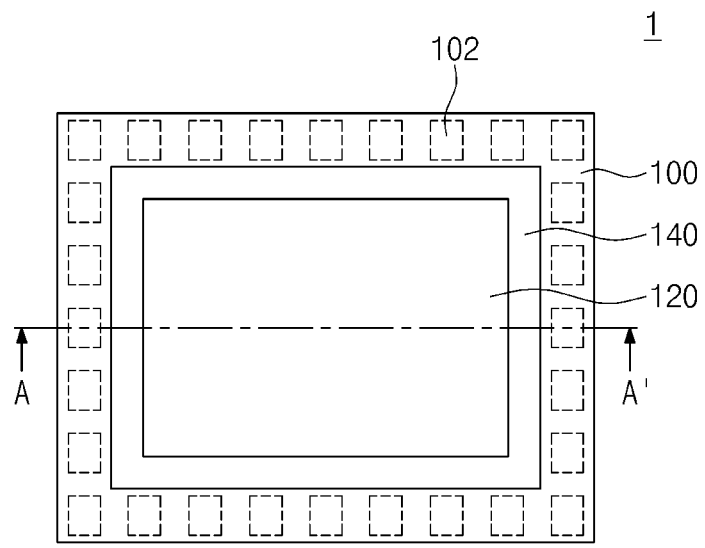
FIG. 1A is a plan view illustrating a semiconductor package according to some embodiments.

Embodiments will now be described more fully with reference to the accompanying drawings, in which particular embodiments are shown. Embodiments may, however, take many different forms and should not be construed as being limited to the particular embodiments set forth herein; rather, these embodiments are provided so that this disclosure will be thorough and complete, and will fully convey the concept of the embodiments to those of ordinary skill in the art.

The drawings are intended to illustrate the general characteristics of methods, structure and/or materials utilized in particular embodiments and to supplement the written description provided below. These drawings may not, however, be to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. Furthermore, the drawings may be illustrated in an idealized manner. However, aspects of the embodiments may depart from an idealized form due to manufacturing tolerances and procedures. The term substantially may be used to encompass such variations.

The use of similar or identical reference numbers in the various drawings is intended to indicate the presence of a similar or identical element or feature, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which the embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
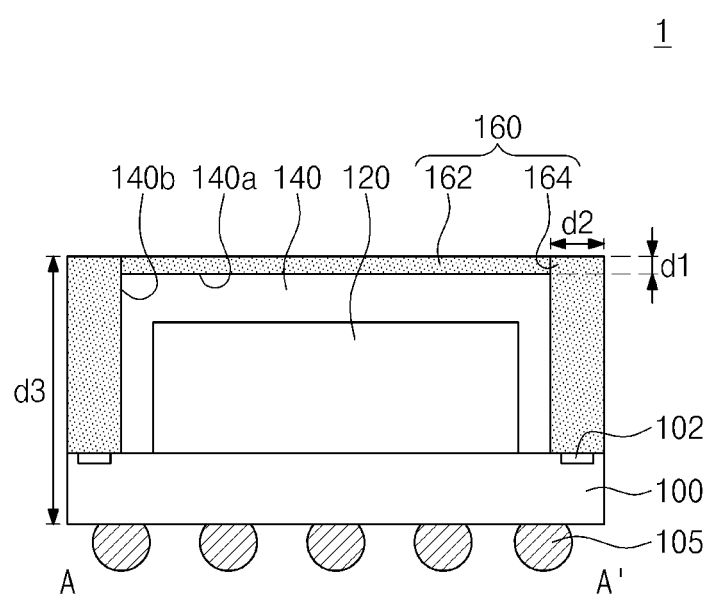
FIG. 1B is a sectional view taken along line A-A' of FIG. 1A.

FIG. 1A is a plan view illustrating a semiconductor package according to some embodiments, and FIG. 1B is a sectional view taken along line A-A' of FIG. 1A.

Referring to FIGS. 1A and 1B, a semiconductor package 1 may include a substrate 100, a semiconductor chip 120, a mold layer 140, and a shielding layer 160. The semiconductor package 1 may include a ball grid array (BGA) structure or a land grid array (LGA) structure. The substrate 100 may be a printed circuit board (PCB) or other substrate on which a semiconductor chip 120 may be mounted. The substrate 100 may include circuit patterns. At least one ground pattern 102 may be disposed on a top surface of the substrate 100. The at least one ground pattern 102 may be disposed near an edge of the substrate 100. When viewed in a plan view, the at least one ground pattern 102 may include multiple ground patterns 102, which are successively arranged to enclose an outer side of the mold layer 140, and each of which is shaped like an island. The ground pattern 102 may be grounded. Outer terminals 105 (e.g., solder balls) may be disposed on a bottom surface of the substrate 100. Each of the ground patterns 102 may be electrically connected to at least one of the outer terminals 105. Although ground patterns 102 have been used as an example, any structure on the substrate that is electrically connected to a fixed potential may be used.

The semiconductor chip 120 may be disposed on the substrate 100. For example, the semiconductor chip 120 may be mounted on the substrate 100 in a wire bonding, flip-chip bonding, or other manner. The semiconductor chip 120 may be a logic chip, a memory chip, another type of chip, or a combination thereof. The mold layer 140 may be disposed to cover the semiconductor chip 120 and may have a top surface 140a and a side surface 140b. The mold layer 140 may include an insulating material, such as an insulating polymer material (e.g., epoxy molding compound (EMC)).

The shielding layer 160 may include a first shielding layer 162 covering the top surface 140a of the mold layer 140 and a second shielding layer 164 covering the side surface 140b of the mold layer 140. The first shielding layer 162 may include a film or tape. The first shielding layer 162 may include at least one of, for example, copper (Cu), nickel (Ni), silver (Ag), gold (Au), platinum (Pt), cobalt (Co), titanium (Ti), chromium (Cr), zirconium (Zr), molybdenum (Mo), tungsten (W), ruthenium (Ru), hafnium (Hf), or rhenium (Re). Since the first shielding layer 162 is provided in the form of the film or tape, it is possible to reduce a thickness d1 of the first shielding layer 162. For example, the thickness d1 of the first shielding layer 162 may range from about 5 μm to about 60 μm. By changing the thickness d1 of the first shielding layer 162, it is possible to control a thickness d3 of the semiconductor package 1. The second shielding layer 164 may be provided on the substrate 100 and along the edge of the substrate 100. The second shielding layer 164 may be electrically connected to the ground pattern 102 on the substrate 100. The second shielding layer 164 may include at least one of, for example, copper (Cu), nickel (Ni), silver (Ag), gold (Au), platinum (Pt), cobalt (Co), titanium (Ti), chromium (Cr), zirconium (Zr), molybdenum (Mo), tungsten (W), ruthenium (Ru), hafnium (Hf), or rhenium (Re). An electromagnetic wave may be blocked by the second shielding layer 164 and the ground pattern 102.

The shielding layer 160 may protect electronic devices sensitive to electromagnetic interference from being affected by an electromagnetic wave. Furthermore, since the shielding layer 160 is formed of a conductive material, the semiconductor package 1 can have an improved heat dissipation property.

FIGS. 2A through 2E are sectional views illustrating a method of fabricating a semiconductor package, according to some embodiments.

Figure 2A:
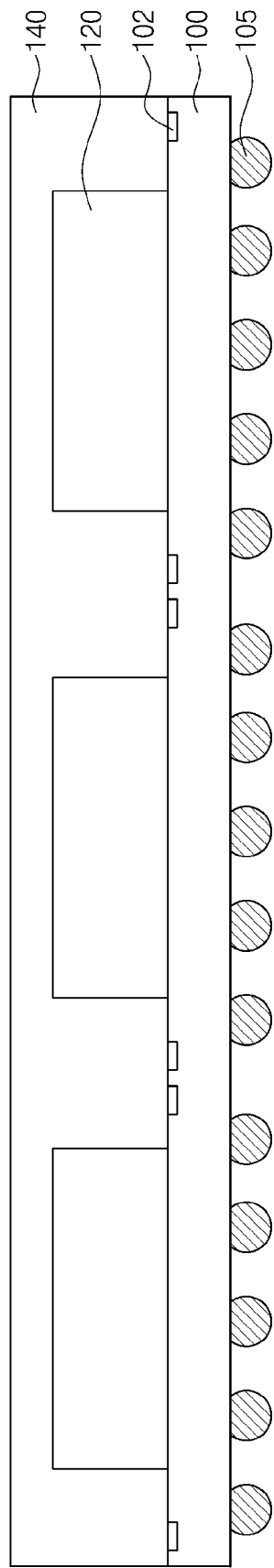

Referring to FIG. 2A, the substrate 100 may be provided in a strip state. Multiple the semiconductor chips 120 may be attached to the top surface of the substrate 100, and the outer terminals 105 may be attached to the bottom surface of the substrate 100. As used herein, attaching may include mounting a structure, forming a structure in situ, or the like. The ground patterns 102 may be formed on the top surface of the substrate 100. The semiconductor chips 120 may be disposed spaced apart from each other. The mold layer 140 may be formed to cover the top surface of the substrate 100 and the semiconductor chips 120. The mold layer 140 may be formed of or include an insulating material, such as an insulating polymer material (e.g., epoxy molding compound (EMC)).

Figure 2B:
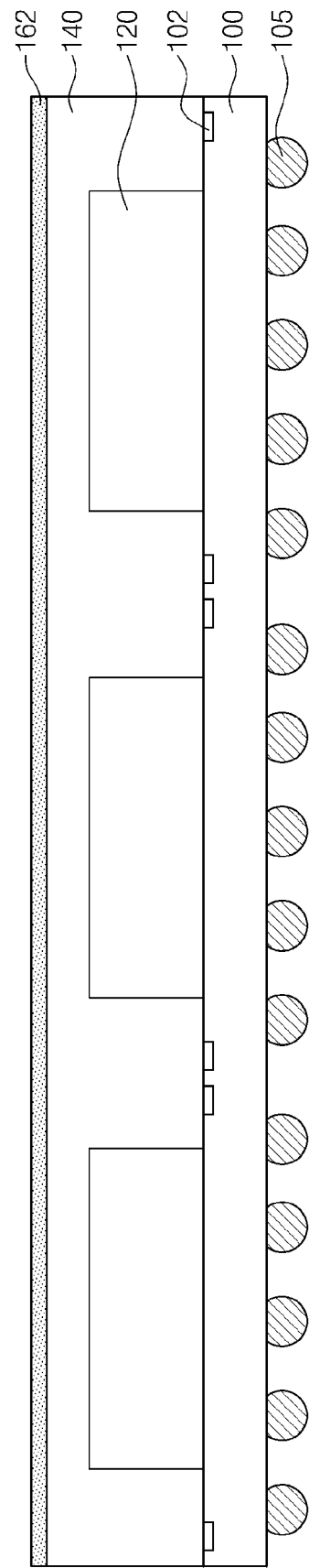

Referring to FIG. 2B, the first shielding layer 162 may be formed on the mold layer 140. The first shielding layer 162 may be formed to have a film or tape shape. The first shielding layer 162 may be attached to a top surface of the mold layer 140.

Referring to FIG. 2C, a first cutting process may be performed on the mold layer 140 to partially expose the top surface of the substrate 100. As a result of the first cutting process, the mold layer 140 and the first shielding layer 162 may be selectively removed. The first cutting process may be performed to form trenches 170 between the semiconductor chips 120 or between the cut portions of the mold layer 140. The trenches 170 may be formed to define the side surface 140b of the mold layer 140. Furthermore, the ground patterns 102 may be exposed at a top surface of the substrate 100.

Referring to FIG. 2D, a conductive paste may be provided in the trenches 170 to form the second shielding layer 164. For example, a conductive paste may be formed using a screen printing method, a direct printing method, or the like. The conductive paste may be cured to form the second shielding layer 164 filling the trenches 170. The second shielding layer 164 may be electrically connected to the ground pattern 102. The second shielding layer 164 may be formed to have a top surface substantially coplanar with that of the first shielding layer 162; however, in other embodiments, the top surface of the second shielding layer 164 may not be coplanar with that of the first shielding layer 162.

Figure 2E:
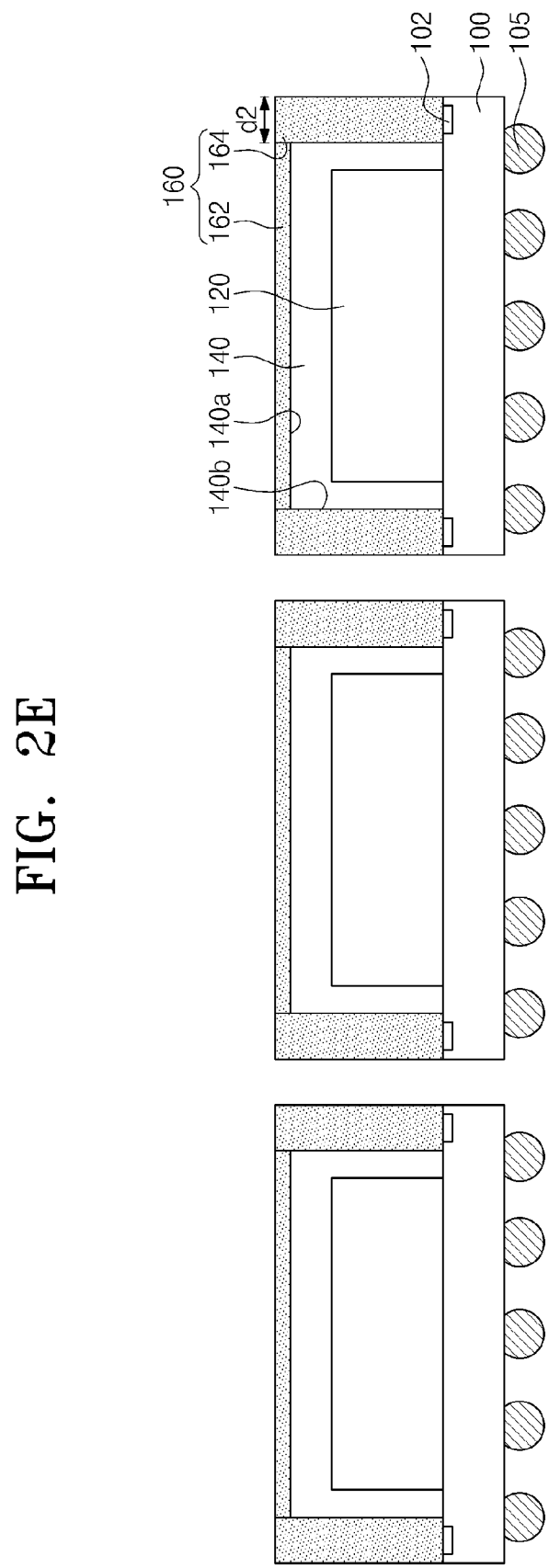

Referring to FIG. 2E, a second cutting process may be performed to separate the semiconductor chips 120 from each other. The second cutting process may be performed to cut not only the second shielding layer 164 but also the substrate 100. For example, the second shielding layer 164 and the substrate 100 may be sequentially cut in a direction perpendicular to the top surface of the substrate 100. The second cutting process may be performed using a saw blade, a laser cutting method, or another cutting technique. The second cutting process may be performed to control the thickness d2 of the second shielding layer 164. For example, a kerf of a saw blade may be selected based on a separation of opposing side surfaces 140b to result in a desired thickness d2. Each of the semiconductor chips 120 divided by the second cutting process may serve as the semiconductor package 1 of FIG. 1.

According to the afore-described method of fabricating the semiconductor package 1, the shielding film may be formed on the strip type of the substrate 100 provided with the semiconductor chips 120, by a single attaching process. The process is performed on the substrate 100 in the strip state, and this makes it possible to more easily load and unload the substrate 100 and simplify the fabrication process. Furthermore, the second shielding layer 164 may be formed on the strip type of the substrate 100 provided with the outer terminals 105 (e.g., solder balls), and thus, it is possible to reduce a chance of or prevent a short circuit from being formed between the second shielding layer 164 and the outer terminal 105. In addition, since the second shielding layer 164 is formed on the strip type of the substrate 100, it is possible to perform the process without new equipment (i.e., cost-effectively).

FIGS. 3A through 3D are sectional views illustrating a method of fabricating a semiconductor package, according to other embodiments. For convenience in description, the aforesaid technical features may be omitted below.

Referring to FIG. 3A, the substrate 100 may be provided in a strip state. Multiple the semiconductor chips 120 may be attached to the top surface of the substrate 100, and the outer terminals 105 may be attached to the bottom surface of the substrate 100.

Referring to FIG. 3B, a mold 180 capable of covering the semiconductor chips 120 may be provided. The first shielding layer 162 may be attached to an inner surface of the mold 180 facing the semiconductor chips 120. The first shielding layer 162 may be provided in the form of a film or tape.

Figure 3C:
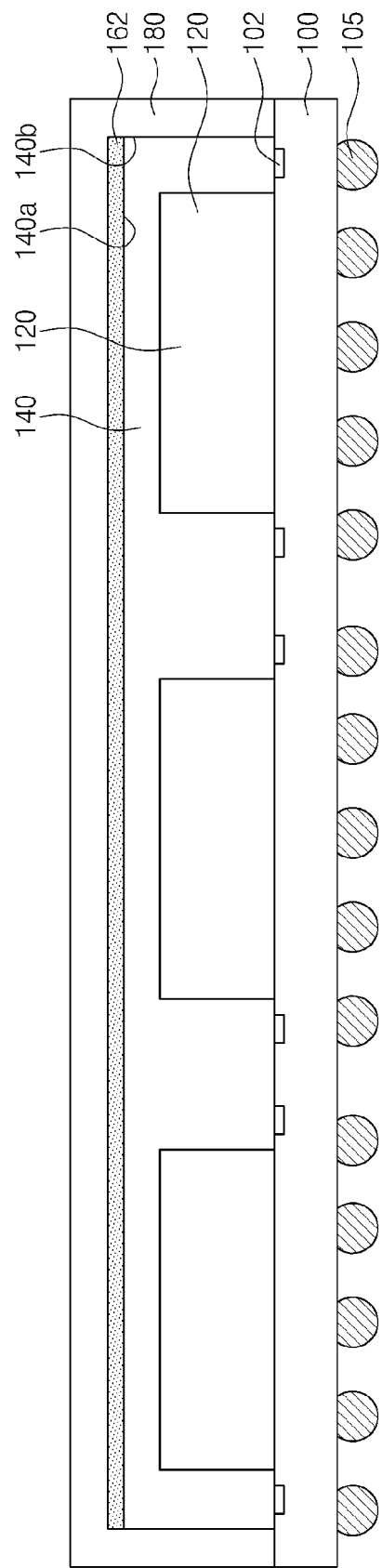

Referring to FIG. 3C, the mold 180 may be disposed on the substrate 100, and then, a molding material may be injected into the mold 180. The molding material may include an insulating material, such as an insulating polymer material (e.g., epoxy molding compound (EMC)). As a result of the injection of the molding material, the mold layer 140 may be formed. In this case, the first shielding layer 162 and the mold layer 140 may be formed at the same time, and thus, the process can be simplified. Furthermore, it is possible to omit a process of forming an additional adhesive layer between the first shielding layer 162 and the mold layer 140, and thus, the process can be more simplified.

Figure 3D:
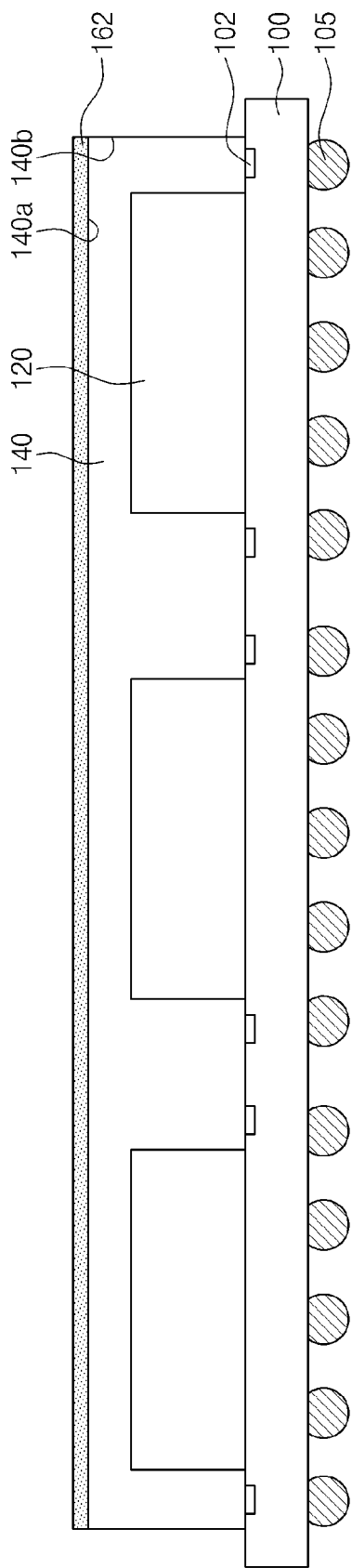

Referring to FIG. 3D, the mold 180 may be removed to form the mold layer 140 covering the semiconductor chips 120 and the first shielding layer 162 provided on the mold layer 140.

The subsequent process may be performed in the same manner as that described with reference to FIGS. 2C through 2E. Accordingly, description thereof will be omitted, for the sake of brevity.

Figure 4A:
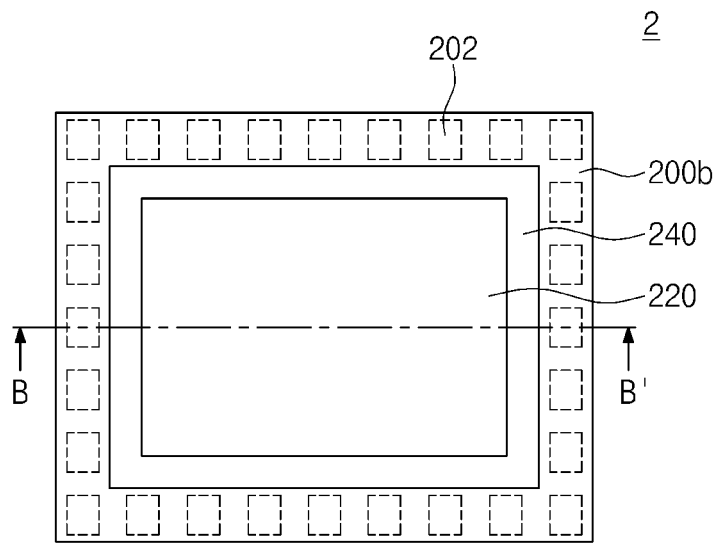
FIG. 4A is a plan view illustrating a semiconductor package according to still other embodiments.
Figure 4B:
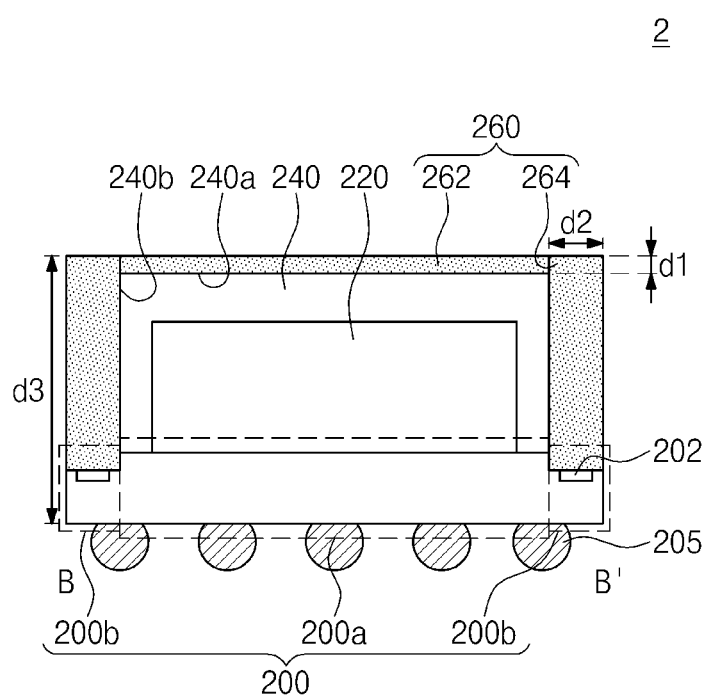
FIG. 4B is a sectional view taken along line B-B' of FIG. 4A.

FIG. 4A is a plan view illustrating a semiconductor package according to still other embodiments, and FIG. 4B is a sectional view taken along line B-B' of FIG. 4A.

Referring to FIGS. 4A and 4B, a semiconductor package 2 may include a substrate 200, a semiconductor chip 220, a mold layer 240, and a shielding layer 260. Semiconductor package 2 may include a ball grid array (BGA) structure or a land grid array (LGA) structure. The substrate 200 may be a printed circuit board (PCB) or any other substrate on which a semiconductor chip may be mounted. The substrate 200 may include a mounting portion 200a, on which the semiconductor chips 220 are mounted, and a ground portion 200b, on which ground patterns 202 are provided. The ground patterns 202 may be exposed, on the ground portion 200b. When viewed in a plan view, the ground patterns 202 may be successively arranged to enclose an outer side of the mold layer 240, and each of them may be shaped like an island. The ground patterns 202 may be grounded. The ground portion 200b may be recessed toward the bottom surface of the substrate 200. In other words, the mounting portion 200a may have a top surface positioned at a higher level than that of the ground portion 200b. Outer terminals 205 (e.g., solder balls) may be attached to the bottom surface of the substrate 200. Each of the ground patterns 202 may be electrically connected to at least one of the outer terminals 205. The outer terminal 205 may be configured to transmit electric power supplied from the outside to the semiconductor package 2.

The semiconductor chips 220 may be disposed on the substrate 200. For example, the semiconductor chip 220 may be mounted on the substrate 200 in a wire bonding, flip-chip bonding, or other manner. The semiconductor chip 220 may be a logic chip, a memory chip, another type of chip, or a combination thereof. The mold layer 240 may be disposed to cover the semiconductor chip 220 and may have a top surface 240a and a side surface 240b. The mold layer 240 may include an insulating material, such as an insulating polymer material (e.g., epoxy molding compound (EMC)).

The shielding layer 260 may include a first shielding layer 262 covering the top surface 240a of the mold layer 240 and a second shielding layer 264 covering the side surface 240b of the mold layer 240. The first shielding layer 262 may be provided in the form of a film or tape. For example, the first shielding layer 262 may include at least one of, for example, copper (Cu), nickel (Ni), silver (Ag), gold (Au), platinum (Pt), cobalt (Co), titanium (Ti), chromium (Cr), zirconium (Zr), molybdenum (Mo), tungsten (W), ruthenium (Ru), hafnium (Hf) or rhenium (Re). The first shielding layer 262 may have a thickness d1 ranging from about 5 μm to about 60 μm. Since the first shielding layer 262 is provided in the form of the film or tape, it is possible to reduce a thickness d1 of the first shielding layer 262. By changing the thickness d1 of the first shielding layer 262, it is possible to control a thickness d3 of the semiconductor package 2. The second shielding layer 264 may be disposed on the ground portion 200b of the substrate 200. The second shielding layer 264 may be disposed on the ground portion 200b and may be electrically connected to the ground pattern 202. Second shielding layer 264 may include at least one of, for example, copper (Cu), nickel (Ni), silver (Ag), gold (Au), platinum (Pt), cobalt (Co), titanium (Ti), chromium (Cr), zirconium (Zr), molybdenum (Mo), tungsten (W), ruthenium (Ru), hafnium (Hf), or rhenium (Re). An electromagnetic wave may be blocked by the second shielding layer 264 and the ground pattern 202.

FIGS. 5A through 5E are sectional views illustrating a method of fabricating a semiconductor package, according to even other embodiments.

Figure 5A:
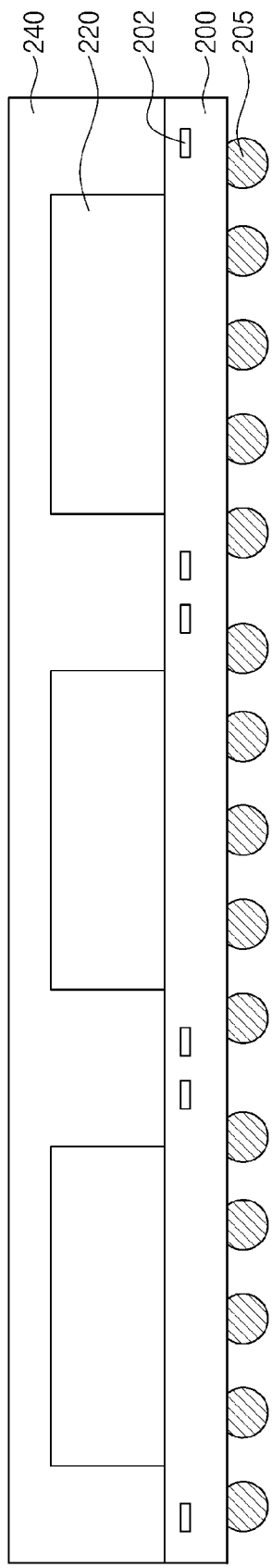
FIGS. 5A through 5E are sectional views illustrating a method of fabricating a semiconductor package, according to even other embodiments.

Referring to FIG. 5A, the substrate 200 may be provided in a strip state. Multiple the semiconductor chips 220 may be attached to the top surface of the substrate 200, and the outer terminals 205 may be attached to the bottom surface of the substrate 200. The semiconductor chips 220 may be disposed spaced apart from each other. The mold layer 240 may be formed to cover the top surface of the substrate 200 and the semiconductor chips 220. The mold layer 240 may be formed of or include an insulating material, such as an insulating polymer material (e.g., epoxy molding compound (EMC)).

Figure 5B:
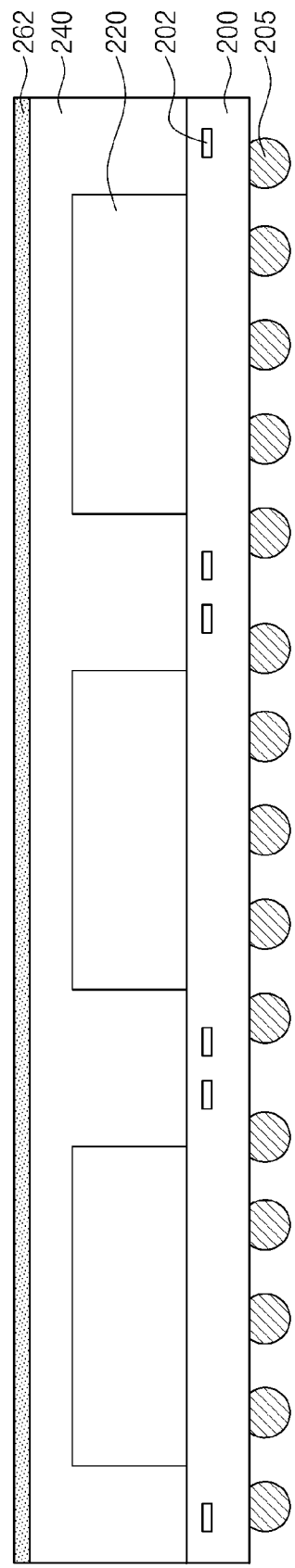

Referring to FIG. 5B, the first shielding layer 262 may be formed on the mold layer 240. The first shielding layer 262 may be provided in the form of a film or tape. The first shielding layer 262 may be attached to a top surface of the mold layer 240.

Figure 5C:
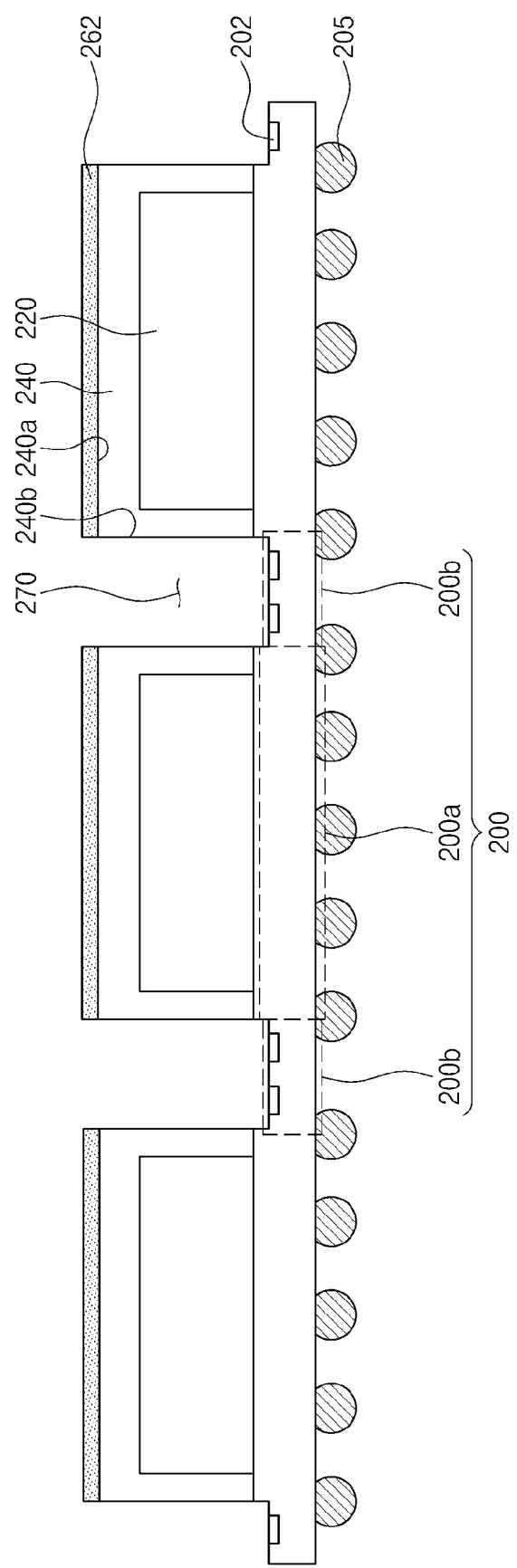

Referring to FIG. 5C, a first cutting process may be performed to cut the mold layer 240 and a portion of the substrate 200 and thereby to expose the ground patterns 202 provided in the substrate 200. As a result of the first cutting process, the substrate 200 may be partially recessed toward the bottom surface of the substrate 200. As a result of the partial recess of the substrate 200, the mounting portion 200a, on which the semiconductor chips 220 are attached, may be formed, and the ground portion 200b exposing the ground patterns 202 may be formed. The substrate 200 may include the mounting portion 200a and the ground portion 200b. The first cutting process may be performed to form trenches 270 between the semiconductor chips 220 or between the cut portions of the mold layer 240. The trenches 270 may be formed to define the side surface 240b of the mold layer 240.

Figure 5D:
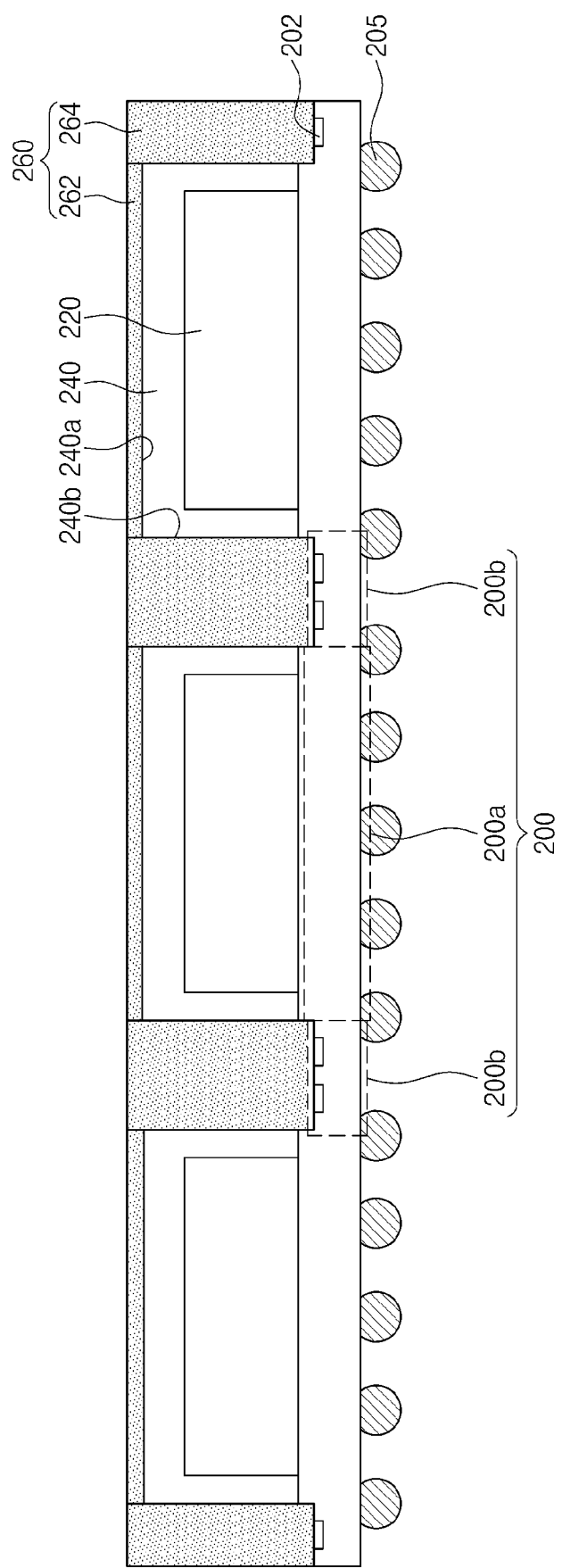

Referring to FIG. 5D, a conductive paste may be formed in the trenches 270 to form the second shielding layer 264. For example, a conductive paste may be injected into the trenches 270 using a screen printing method, a direct printing method, or the like. The conductive paste may be cured to form the second shielding layer 264. The second shielding layer 264 may be formed on the ground portion 200b of the substrate 200. The second shielding layer 264 may be electrically connected to the ground pattern 202. The second shielding layer 264 may be formed to have a top surface substantially coplanar with that of the first shielding layer 262; however, in other embodiments, the top surface of the second shielding layer 264 may not be coplanar with that of the first shielding layer 262.

Figure 5E:
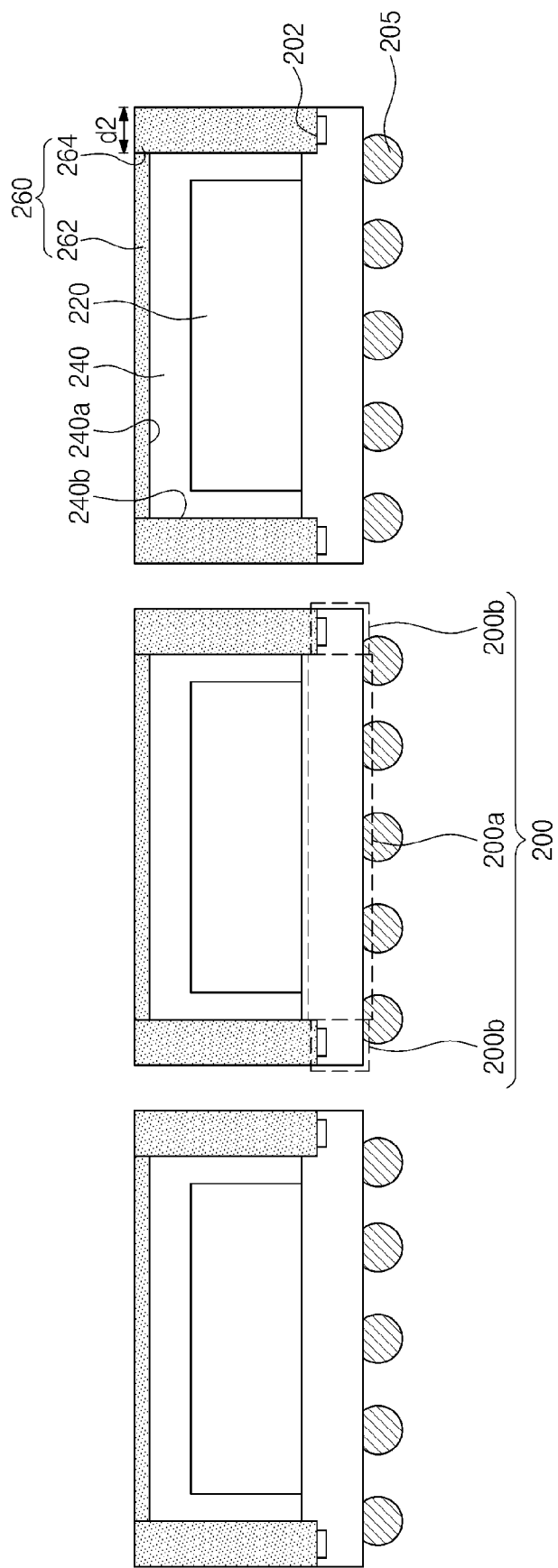

Referring to FIG. 5E, a second cutting process may be performed to separate the semiconductor chips 220 from each other. The second cutting process may be performed to cut not only the second shielding layer 264 but also the substrate 200. For example, the second shielding layer 264 and the substrate 200 may be sequentially cut in a direction perpendicular to the top surface of the substrate 200. The second cutting process may be performed to control the thickness d2 of the second shielding layer 264. Each of the semiconductor chips 220 divided by the second cutting process may serve as the semiconductor package 2 of FIGS. 4A and 4B.

According to the afore-described method of fabricating the semiconductor package 2, the shielding layer may be formed on the strip type of the substrate 200 provided with the semiconductor chips 220, by a single attaching process. The process is performed on the substrate 200 in the strip state, and this makes it possible to more easily load and unload the substrate 200 and simplify the fabrication process. Furthermore, the second shielding layer 264 may be formed on the strip type of the substrate 200 provided with the outer terminals 205 (e.g., solder balls), and thus, it is possible to reduce a chance of or prevent a short circuit from being formed between the second shielding layer 264 and the outer terminal 205. In addition, since the second shielding layer 264 is formed on the strip type of the substrate 200, it is possible to perform the process without new equipment (i.e., cost-effectively).

Figure 6:
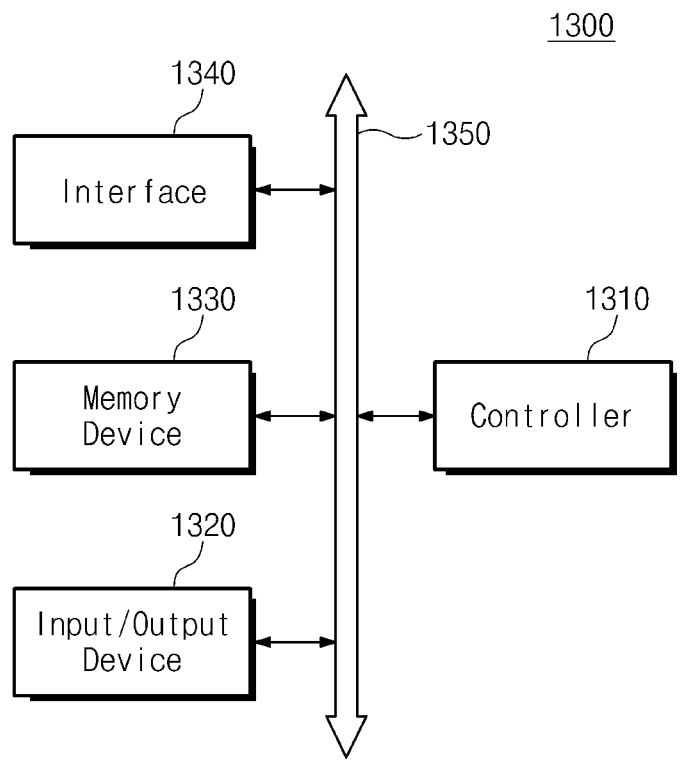
FIG. 6 is a schematic block diagram illustrating an electronic system including a semiconductor package according to some embodiments.

FIG. 6 is a block diagram schematically illustrating an electronic system including a semiconductor package according to some embodiments.

The semiconductor package according to some embodiments may be used in an electronic system. For example, the semiconductor package according to an embodiment may be provided in the form of a memory device. Referring to FIG. 6, an electronic system 1300 may include a controller 1310, an input/output (I/O) device 1320, and a memory device 1330. The controller 1310, the I/O device 1320, and the memory device 1330 may be combined with each other through a data bus 1350. The data bus 1350 may correspond to a path through which electrical signals are transmitted. The controller 1310 may include at least one of a microprocessor, a digital signal processor, a microcontroller, or another similar logic device. The controller 1310 and the memory device 1330 may include one or more of the semiconductor packages according to various embodiments. The I/O device 1320 may include at least one of a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 configured to transmit electrical data to a communication network or receive electrical data from a communication network. The interface unit 1340 may be configured to operate in a wireless or wired manner. For example, the interface unit 1340 may include an antenna for wireless communication or a transceiver for wired communication. Although not shown in the drawings, the electronic system 1300 may further include an application chipset, a camera image processor (CIS), and an input-output unit.

The electronic system 1300 may be realized as a mobile system, a personal computer, an industrial computer, a logic system, or the like configured to perform various functions. For example, the mobile system may be one of a personal digital assistant (PDA), a portable computer, a web tablet, a wireless phone, a mobile phone, a laptop computer, a digital music system, and an information transmit/receive system. When the electronic system 1300 is configured to perform wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 7:
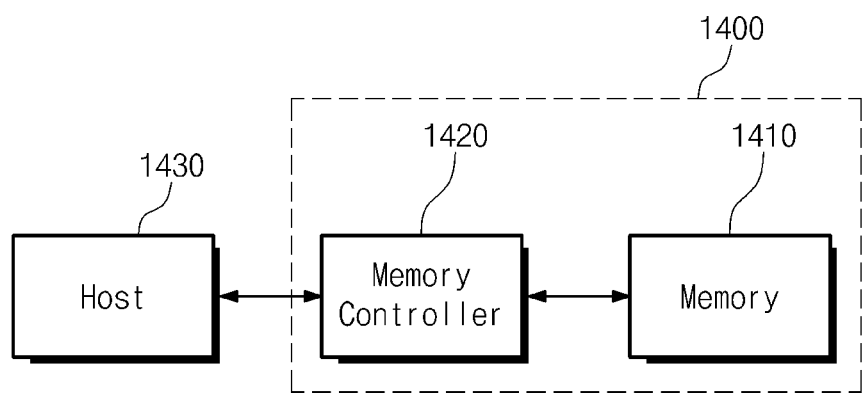
FIG. 7 is a schematic block diagram illustrating an example of memory systems including a semiconductor package according to some embodiments.

FIG. 7 is a block diagram illustrating an example of memory systems including a semiconductor package according to various embodiments.

The semiconductor package may be provided in the form of a memory card. Referring to FIG. 7, a memory system 1400 may include a non-volatile memory device 1410 (e.g., a FLASH memory device) and a memory controller 1420. The non-volatile memory device 1410 and the memory controller 1420 may be configured to store data or read stored data. The non-volatile memory device 1410 may include at least one of the semiconductor packages according to various embodiments. The memory controller 1420 may be configured to control the non-volatile memory device 1410 to read the stored data and/or to store data in response to read/write requests of a host 1430.

According to some embodiments, a shielding film may be attached to a substrate in a strip state, and this makes it possible to simplify a fabrication process.

According to other embodiments, a shielding layer may be formed to have a film or tape shape and thereby have a thin thickness.

Embodiments provide a semiconductor package, in which a shielding film attached to a substrate in a strip state is provided, and a method of fabricating the same.

Some embodiments include a method of fabricating a semiconductor package may include forming multiple semiconductor chips on a substrate, forming a mold layer to cover the semiconductor chips, forming a first shielding layer on the mold layer, cutting the mold layer and the first shielding layer to form trenches between the semiconductor chips, forming a second shielding layer to fill the trenches, and cutting the second shielding layer and the substrate to separate the semiconductor chips from each other.

In some embodiments, the forming of the first shielding layer may include attaching a shielding film on the mold layer.

In some embodiments, the forming of the second shielding layer may include injecting a conductive paste into the trenches using a screen printing method, and curing the conductive paste.

In some embodiments, the forming of the first shielding layer may be performed at the same time as the forming of the mold layer.

In some embodiments, the forming of the mold layer and the first shielding layer may include providing a mold to cover the semiconductor chips, attaching a shielding film to an inner surface of the mold, and injecting a molding material in the mold to form the mold layer and the first shielding layer at the same time.

In some embodiments, the trenches may be formed to expose a top surface of the substrate.

In some embodiments, the substrate may include multiple ground patterns, and the cutting of the mold layer and the first shielding layer may be performed to expose the ground pattern through the trenches.

In some embodiments, the second shielding layer may be electrically connected to the ground patterns, thereby being grounded.

In some embodiments, when viewed in a plan view, the ground patterns that are formed to enclose each of the semiconductor chips.

In some embodiments, the cutting of the mold layer may include recessing a top portion of the substrate.

In some embodiments, the cutting of the mold layer may be performed to expose a ground pattern provided on a ground portion of the substrate, and the second shielding layer may be electrically connected to the ground pattern, thereby being grounded.

In some embodiments, the substrate may include a mounting portion, on which the semiconductor chips are provided, and a ground portion having a recessed profile. A top surface of the mounting portion of the substrate may be positioned at a higher level than that of the ground portion of the substrate.

In some embodiments, the first shielding layer may be formed to have a thickness ranging from about 5 µm to about 10 µm.

In some embodiments, the semiconductor package may include a ball grid array structure or a land grid array structure.

In some embodiments, at least one of the first and second shielding layers includes at least one of copper (Cu), nickel (Ni), silver (Ag), gold (Au), platinum (Pt), cobalt (Co), titanium (Ti), chromium (Cr), zirconium (Zr), molybdenum (Mo), tungsten (W), ruthenium (Ru), hafnium (Hf), or rhenium (Re).

While embodiments have been particularly shown and described, it will be understood by one of ordinary skill in the art that variations in form and detail may be made therein without departing from the spirit and scope of the attached claims.

What is claimed is:

1. A method of fabricating a semiconductor package, comprising:
    providing a substrate including a plurality of semiconductor chips;
    forming a mold layer covering the semiconductor chips;
    forming a first shielding layer on the mold layer;
    cutting the mold layer and the first shielding layer to form trenches between the semiconductor chips; and
    forming a second shielding layer to fill the trenches and electrically connect conductive patterns at bottoms of the trenches,
    wherein the forming of the first shielding layer on the mold layer is performed at the same time as the forming of the mold layer.

2. The method of claim 1, further comprising cutting the second shielding layer and the substrate to separate the semiconductor chips from each other.

3. The method of claim 1, wherein the forming of the first shielding layer comprises attaching a shielding film on the mold layer.

4. The method of claim 1, wherein the forming of the second shielding layer comprises:
    injecting a conductive paste into the trenches; and
    curing the conductive paste.

5. The method of claim 1, wherein the forming of the mold layer and the forming of the first shielding layer comprises:
    providing a mold to cover the plurality of semiconductor chips;
    attaching a shielding film to an inner surface of the mold; and
    injecting a molding material in the mold to form the mold layer and the first shielding layer at the same time.

6. The method of claim 1, wherein the first shielding layer is formed to have a thickness ranging from about 5 µm to about 10 µm.

7. The method of claim 1, wherein the semiconductor package comprises a ball grid array structure or a land grid array structure.

8. The method of claim 1, wherein at least one of the first and second shielding layers comprises at least one of copper (Cu), nickel (Ni), silver (Ag), gold (Au), platinum (Pt), cobalt (Co), titanium (Ti), chromium (Cr), zirconium (Zr), molybdenum (Mo), tungsten (W), ruthenium (Ru), hafnium (Hf), and rhenium (Re).

9. The method of claim 1, wherein the first shielding layer is a film or a tape.

10. The method of claim 1, wherein the cutting of the mold layer and the first shielding layer comprises exposing ground patterns of the substrate as the conductive patterns.

11. The method of claim 10, wherein the ground patterns are disposed on a top surface of the substrate.

12. The method of claim 10, wherein the forming of the second shielding layer comprises electrically connecting the second shielding layer to the ground patterns.

13. The method of claim 10, wherein the providing of the substrate comprises providing the substrate with the ground patterns such that for each of the semiconductor chips, when viewed in a plan view, the ground patterns are disposed around that semiconductor chip.

14. The method of claim 10, wherein the cutting of the mold layer comprises recessing a top portion of the substrate to expose the ground patterns.

15. The method of claim 14, wherein the forming of the second shielding layer comprises electrically connecting the second shielding layer to the ground patterns after recessing the top portion of the substrate.

16. The method of claim 14, wherein the recessing of the top portion of the substrate comprises recessing a ground portion outside of a mounting portion on which the semiconductor chips are disposed such that the mounting portion of the substrate is positioned at a higher level than that of the ground portion of the substrate.

17. A method of fabricating a semiconductor package, comprising:
    providing a substrate including a plurality of semiconductor chips;
    forming a mold layer covering the semiconductor chips;
    forming a first shielding layer on the mold layer;
    sequentially removing portions of the first shielding layer and portions of the mold layer to expose ground patterns on the substrate under the removed portions of the mold layer; and
    forming a second shielding layer to electrically connect the ground patterns and the first shielding layer.

18. The method of claim 17, wherein the exposing of the ground patterns on the substrate comprises recessing a portion of the substrate to expose the ground patterns disposed under the recessed portion.

19. The method of claim 17, wherein the ground patterns are disposed on a top surface of the substrate.

* * * * *